United States Patent
Ueda et al.

(10) Patent No.: US 10,961,420 B2
(45) Date of Patent: Mar. 30, 2021

(54) COMPOSITION FOR BONDING, OPTICAL ADHESIVE, AND ADHESIVE FOR PRESSURE SENSOR

(71) Applicant: SEKISUI CHEMICAL CO., LTD., Osaka (JP)

(72) Inventors: Saori Ueda, Shiga (JP); Yasuyuki Yamada, Shiga (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 185 days.

(21) Appl. No.: 16/304,193

(22) PCT Filed: May 22, 2017

(86) PCT No.: PCT/JP2017/018992
§ 371 (c)(1),
(2) Date: Nov. 23, 2018

(87) PCT Pub. No.: WO2017/204145
PCT Pub. Date: Nov. 30, 2017

(65) Prior Publication Data
US 2020/0317972 A1 Oct. 8, 2020

(30) Foreign Application Priority Data

May 24, 2016 (JP) .............................. JP2016-103419

(51) Int. Cl.
| | | |
|---|---|---|
| C09J 183/06 | (2006.01) | |
| C08G 77/20 | (2006.01) | |
| G01L 19/14 | (2006.01) | |

(52) U.S. Cl.
CPC ............ C09J 183/06 (2013.01); C08G 77/20 (2013.01); G01L 19/147 (2013.01)

(58) Field of Classification Search
None
See application file for complete search history.

(56) References Cited

U.S. PATENT DOCUMENTS

| | | | | |
|---|---|---|---|---|
| 5,903,391 A | * | 5/1999 | Toshima | .............. G02B 5/0226 |
| | | | | 359/529 |
| 2005/0249446 A1 | | 11/2005 | Kohinata et al. | |
| 2012/0326391 A1 | | 12/2012 | Hirose et al. | |
| 2014/0350171 A1 | * | 11/2014 | Matsumoto | .......... C09D 147/00 |
| | | | | 524/559 |
| 2017/0025374 A1 | | 1/2017 | Fujiwara et al. | |

FOREIGN PATENT DOCUMENTS

| | | |
|---|---|---|
| EP | 2 660 927 | 11/2013 |
| EP | 3 375 808 | 9/2018 |
| JP | 2004-99863 | 4/2004 |
| JP | 2008-239638 | 10/2008 |
| JP | 2010-100841 | 5/2010 |
| JP | 2010-225625 | 10/2010 |
| JP | 2012-136614 | 7/2012 |
| JP | 2012-209097 | 10/2012 |
| JP | 2013-10957 | 1/2013 |
| JP | 2014/088095 | 6/2014 |
| WO | 2009/119788 | 10/2009 |
| WO | 2015/151136 | 10/2015 |
| WO | 2017/082353 | 5/2017 |

OTHER PUBLICATIONS

International Search Report dated Jun. 13, 2017 in International (PCT) Application No. PCT/JP2017/018992.
Extended European Search Report dated Dec. 18, 2019 in corresponding European Patent Application No. 17802737.1.

* cited by examiner

*Primary Examiner* — Robert S Loewe
(74) *Attorney, Agent, or Firm* — Wenderoth, Lind & Ponack, L.L.P.

(57) ABSTRACT

Provided is a composition for bonding that forms, after bonding, an adhesive layer that is less likely to undergo shape deformation, and can maintain high adhesion after a reliability test; also provided are an optical adhesive and an adhesive for pressure sensors, both of which comprise the composition. The composition for bonding comprises resin particles. The resin particles have a recovery rate of 20% or less, and a cured product of the composition with a thickness of 250±50 μm has a moisture permeability of 90 g/m²-24 h or less. An adhesive layer formed from the composition for bonding is less likely to undergo shape deformation, and can maintain high adhesion after a reliability test.

7 Claims, No Drawings

COMPOSITION FOR BONDING, OPTICAL ADHESIVE, AND ADHESIVE FOR PRESSURE SENSOR

TECHNICAL FIELD

The present invention relates to a composition for bonding, and an optical adhesive and an adhesive for pressure sensors, both of which comprise the composition.

BACKGROUND ART

Higher precision has recently been required for optical components, such as optical lenses, and electronic components, such as semiconductor devices and pressure sensors. To make optical components, electronic components, and like components more precise, adhesives used to assemble these components have an important role. Conventionally known adhesives are adhesion compositions comprising an epoxy resin having curability, and adhesion compositions comprising other resins as adhesion components (see, for example, PTL 1).

CITATION LIST

Patent Literature

PTL 1: JP2004-99863A

SUMMARY OF INVENTION

Technical Problem

For example, when an adhesive comprising an epoxy resin etc. mentioned above is used to bond an optical lens to produce an optical component, it is necessary to bond the optical lens while adjusting the optical axis. However, the adhesive tends to shrink when the epoxy resin is cured. This caused problems such that horizontal distortion was highly likely to occur, and that the optical axis adjusted during bonding was easily shifted. Further, even if the optical axis was adjusted during bonding, the cured adhesive was gradually degraded over time under the influence of moisture etc., or deformed due to expansion etc., thereby reducing the adhesion force in some cases. This sometimes problematically resulted in displacement of the optical axis.

The present invention was made in consideration of the above problems. An object of the present invention is to provide a composition for bonding that forms, after bonding, an adhesive layer that is less likely to undergo shape deformation, and can maintain high adhesion after a reliability test; and to also provide an optical adhesive and an adhesive for pressure sensors, both of which comprise the composition.

Solution to Problem

The present inventors conducted extensive research to achieve the above object, and consequently found that the above object can be achieved by incorporating resin particles having a specific recovery rate, and controlling moisture permeability. Thus, the present invention has been completed.

That is, the present invention includes, for example, the main subjects described in the following items.

Item 1. A composition for bonding comprising resin particles,
the resin particles having a recovery rate of 30% or less, and
a cured product with a thickness of 250±50 μm obtained from the composition for bonding having a moisture permeability of 90 g/m$^2$-24 h or less.

Item 2. The composition for bonding according to Item 1, wherein the resin particles have a 10% K value of 500 N/mm$^2$ or less.

Item 3. The composition for bonding according to Item 1 or 2, wherein the resin particles have a decomposition starting temperature of 300° C. or more.

Item 4. The composition for bonding according to any one of Items 1 to 3, wherein the resin particles are silicone particles.

Item 5. The composition for bonding according to any one of Items 1 to 4, wherein the content of the resin particles is 0.1 wt. % or more and 40 wt. % or less.

Item 6. An optical adhesive comprising the composition for bonding according to any one of Items 1 to 5.

Item 7. An adhesive for pressure sensors, the adhesive comprising the composition for bonding according to any one of Items 1 to 5.

Advantageous Effects of Invention

The composition for bonding according to the present invention fouls, after bonding, an adhesive layer that is less likely to undergo shape deformation, and can maintain high adhesion after a reliability test. Therefore, the composition for bonding according to the present invention is a material suitable for optical adhesives for assembling optical components, such as optical lenses, and adhesives for assembling electronic components, such as pressure sensors (particularly adhesives for pressure sensors).

DESCRIPTION OF EMBODIMENTS

Embodiments of the present invention are described in detail below. In the present specification, the terms "contain" and "comprise" include the concepts of "contain," "comprise," "substantially consist of," and "consist of."

The composition for bonding of the present embodiment is a composition for bonding comprising resin particles, the resin particles having a recovery rate of 30% or less, and a cured product of the composition with a thickness of 250±50 μm having a moisture permeability of 90 g/m$^2$-24 h or less.

According to the above composition for bonding, because the recovery rate of the resin particles and the moisture permeability of the above cured product are within specific ranges, an adhesive layer formed after bonding is less likely to undergo shape deformation, and can maintain high adhesion after a reliability test.

The resin particles have a recovery rate of 30% or less. The recovery rate of the resin particles as mentioned herein can be measured by a known method, and refers to, for example, a value measured in the following manner. Specifically, a maximum test load of 10 mN per resin particle is applied by a commercially available micro-compression tester, the load is then removed, and compression displacement L1 (mm) and recovery displacement L2 (mm) at this time are measured. The recovery rate can be calculated from the measured value by the following formula:

recovery rate (%)=(L2/L1)×100.

When resin particles having a recovery rate of 30% or less are deformed upon application of stress, the deformed shape is maintained or only slightly recovered. Therefore, when optical components, electronic components, etc., are produced using adhesives comprising such resin particles, even if stress is applied to these components after bonding, the stress can be relieved by the resin particles having a recovery rate of 30% or less. For this reason, the deformation of adhesive layers formed from the adhesives is suppressed; thus, optical components, electronic components, etc., are less likely to displace or damage, and highly precise optical components, electronic components, etc., can be formed.

Thus, the resin particles having a recovery rate of 30% or less are capable of relieving stress; that is, they have an excellent stress-relief effect. The resin particles are a component acting as a "stress-relief agent" in the composition for bonding.

The recovery rate of the resin particles is preferably 20% or less, and particularly preferably 15% or less.

When the composition for bonding of the present embodiment is used to form a cured product with a thickness of 250±50 μm, the moisture permeability of the cured product is 90 g/m$^2$-24 h or less. That is, the moisture permeability of the cured product of the composition for bonding is 90 g/m$^2$-24 h or less when the thickness of the cured product is 250±50 μm. Because the upper limit of the moisture permeability is the above value, an adhesive layer (cured product) formed by curing the composition for bonding has low moisture permeability, and is thus less likely to expand due to humidity (moisture) etc. The shape of the adhesive layer is thereby less susceptible to the influence of moisture, humidity, etc., and the adhesive layer has high adhesion after a reliability test. The reliability test as mentioned herein refers to, for example, a test that performs 2000 or more thermal cycles at −40 to 250° C.; however, it is not limited thereto.

The moisture permeability of the cured product with a thickness of 250±50 μm obtained from the composition for bonding of the present embodiment is preferably 70 g/m$^2$-24 h or less.

The moisture permeability (unit; g/m$^2$-24 h) as mentioned herein is a value according to JIS 20208, and refers to the amount of water vapor passing through a film-like material per unit area for certain period of time. Specifically, a moisture-proof packaging material is used as an interface at 80° C., air on one side of the interface is maintained at a relative humidity of 90% RH, and air on the other side is maintained in a dry state using a moisture-absorbing material. Then, the mass (g) of water vapor passing through the interface in 24 hours is converted into a value per m$^2$ of the material. This value is defined as the moisture permeability of the material.

A method for forming a cured product with a thickness of 250±50 μm using the composition for bonding of the present embodiment can be performed using a commercially available coater. Specifically, the composition for bonding of the present embodiment is applied to a desired thickness by a coater, and then heated at 120° C. for 60 minutes, thereby forming a cured product with a thickness of 250±50 μm. When the composition for bonding contains a photo-curing initiator, a cured product of the composition for bonding can be obtained by performing light irradiation at 2000 mJ/cm$^2$ using a high-pressure mercury lamp.

The type of resin particles is not particularly limited, as long as they have a recovery rate of 30% or less, and the moisture permeability of a cured product with a thickness of 250±50 μm obtained from the composition for bonding can be adjusted to 90 g/m$^2$-24 h or less.

Examples of the type of resin for forming resin particles include polyethylene; polypropylene; polystyrene; silicone resins; polyvinyl chloride; polyvinylidene chloride; polyolefin resins, such as polyisobutylene and polybutadiene; acrylic resins, such as polymethyl methacrylate and polymethyl acrylate; polyalkylene terephthalate; polycarbonate; polyamide; phenol formaldehyde resins; melamine formaldehyde resins; benzoguanamine formaldehyde resins; urea formaldehyde resins; phenol resins; melamine resins; benzoguanamine resins; urea resins; epoxy resins; unsaturated polyester resins; saturated polyester resins; polysulfone; polyphenylene oxide; polyacetal; polyimide; polyamideimide; polyetheretherketone; polyethersulfone; and polymers obtained by polymerizing one or more various polymerizable monomers having an ethylenically unsaturated group.

When the above resin is a polymer of a monomer having an ethylenically unsaturated group, examples of the monomer having an ethylenically unsaturated group include non-crosslinkable monomers and crosslinkable monomers.

The non-crosslinkable monomers are specifically as follows. Examples of vinyl compounds include styrene-based monomers, such as styrene, α-methylstyrene, and chlorostyrene; vinyl ethers, such as methyl vinyl ether, ethyl vinyl ether, propyl vinyl ether, 1,4-butanediol divinyl ether, cyclohexanedimethanol divinyl ether, and diethylene glycol divinyl ether; acid vinyl esters, such as vinyl acetate, vinyl butyrate, vinyl laurate, and vinyl stearate; and halogen-containing monomers, such as vinyl chloride and vinyl fluoride. Examples of (meth)acrylic compounds include alkyl (meth)acrylates, such as methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate, and isobornyl (meth)acrylate; oxygen atom-containing (meth)acrylates, such as 2'-hydroxyethyl (meth)acrylate, glycerol (meth)acrylate, polyoxyethylene (meth)acrylate, and glycidyl (meth)acrylate; nitrile-containing monomers, such as (meth)acrylonitrile; and halogen-containing (meth)acrylates, such as trifluoromethyl (meth)acrylate and pentafluoroethyl (meth)acrylate. Examples of α-olefin compounds include olefins, such as diisobutylene, isobutylene, Linealene, ethylene, and propylene. Examples of conjugated diene compounds include isoprene and butadiene.

The crosslinkable monomers are specifically as follows. Examples of vinyl compounds include vinyl-based monomers, such as divinylbenzene, 1,4-divinyloxybutane, and divinylsulfone. Examples of (meth)acrylic compounds include polyfunctional (meth)acrylates, such as tetramethylolmethane tetra(meth)acrylate, polytetramethylene glycol diacrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, (poly)ethylene glycol di(meth)acrylate, (poly)propylene glycol di(meth)acrylate, (poly)tetramethylene glycol di(meth)acrylate, and 1,4-butanediol di(meth)acrylate Examples of allyl compounds include triallyl (iso)cyanurate, triallyl trimellitate, diallyl phthalate, diallyl acrylamide, and diallyl ether. Examples of silicone compounds include silane alkoxides, such as tetramethoxysilane, tetraethoxysilane, triethylsilane, t-butyldimethylsilane, methyltrimethoxysilane, methyltriethoxysilane, ethyltrimethoxysilane, ethyltriethoxysilane, isopropyltrimethoxysilane, isobutyltrimethoxysilane, cyclohexyltrimethoxysilane, n-hexyltrimethoxysilane, n-octyltriethoxysilane, n-decyltrimethoxysilane, phenyltrimethoxysilane, dimethyldimethoxysilane, dimethyldiethoxysilane, diisopropyldimethoxysilane, trimethoxysilylstyrene, γ-(meth)acryloxypropyltrimethoxysilane, 1,3-divinyltetramethyldislloxane, methylphenyldimethoxysilane, and diphenyldimethoxysilane; polymerizable double bond-containing silane alkoxides, such as vinyltrimethoxysilane, vinyltriethoxysilane, dimethoxymethylvinyisilane, dimethoxyethylvinylsilane, diethoxymethylvinylsilane, diethoxyethylvinylsilane, ethylmethyldivinylsilane, methylvinyldimethoxysilane, ethylvinyldimethoxysilane, methylvinyldiethoxysilane, ethylvinyldiethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, and 3-acryloxyprophyltrimethoxysilane; cyclic siloxanes, such as decamethylcyclopentasiloxane; modified (reactive) silicone oils, such as one-end modified silicone oil, both-end silicone oil, and side-chain silicone oil; and carboxyl group-containing monomers, such as (meth)acrylic acid, maleic acid, and maleic anhydride.

The method for forming a resin from a polymerizable monomer having an ethylenically unsaturated group mentioned above is not limited. The resin can be produced by a known method, such as polymerization by a radical polymerization method.

The above resin may be a homopolymer composed of one type of repeating structural unit, or a copolymer composed of two or more types of repeating structural units. In the case of a copolymer, the copolymer may have any structure of a random copolymer, a block copolymer, an alternating copolymer, or the like.

The resin particles are preferably silicone particles. Silicone particles are particles comprising a silicone resin.

The type of silicone particles is not limited, as long as they have a recovery rate of 30% or less, and the moisture permeability of a cured product with a thickness of 250±50 µm obtained from the composition for bonding can be adjusted to 90 g/m$^2$-24 h or less.

Silicone as mentioned herein refers to an organosilicon compound. Examples of silicone include so-called organopolysiloxane, which has, as a skeleton, a structure in which siloxane bonds (—Si—O—) are repeatedly formed, and in which organic groups bind to the siloxane bonds.

Examples of silicone particles include silicone rubber particles, silicone resin particles, and composite particles thereof.

The silicone rubber particles are, for example, particles comprising molecules formed by crosslinking of organosilicon compounds, such as linear or branched dimethylpolysiloxane.

The silicone resin particles may be, for example, particles of cured polyorganosilsesquioxane having a structure in which siloxane bonds represented by (RSiO$_{3/2}$)n are crosslinked in a three-dimensional network form.

The silicone particles may have a structure in which the surface of spherical silicone rubber is further coated with a silicone resin.

Moreover, the silicone particles may be a mixture or composite of silicone and a material other than silicone. For example, the silicone particles may be particles obtained by coating the surface of resin particles, other than silicone, with silicone, or particles obtained by coating the surface of silicone particles with other resins. Examples of other resins include the same type of resins as those for forming the above resin particles, and particularly include acrylic resins, styrene resins, etc.

Further, the silicone particles may be particles in which silicone and a resin other than silicone are mixed uniformly or randomly. In this case, the network structure that forms a silicone skeleton has a narrow network, which is effective to prevent moisture permeability.

Thus, the silicone particles may be particles consisting of silicone, or particle comprising a material containing silicone. When a material other than silicone is contained, the mixing form thereof is not particularly limited.

Since some silicone particles have a hydrophilic group, such as a hydroxyl group, in Si depending on their skeleton structure, the moisture permeability may be relatively high. When the composition for bonding contains such silicone particles, the adhesive layer absorbs moisture and expands, which may consequently cause problems, such as displacement of the object to be bonded and reduction in adhesion force after a reliability test.

In contrast, according to the composition for bonding of the present embodiment, the moisture permeability of a cured product of the composition for bonding is adjusted to 90 g/m$^2$-24 h or less, as described above; thus, even though silicone particles are contained, the moisture permeability is low, and the adhesive layer is less likely to undergo expansion etc.

It is preferable that the silicone particles have a crosslinked structure, and that the distance between crosslinking points in the crosslinked structure is such that the number of repeating units (n) of siloxane bonds (—Si—O—) is 20 or more. The silicone particles thereby have a lower recovery rate, and the deformation of the adhesive layer can be more easily suppressed. The upper limit of the number of repeating units (n) of siloxane bonds (—Si—O—) between crosslinking points is preferably 60.

It is also preferable that the surface of the silicone particles is coated with silica or a resin other than silicone. In this case, the moisture permeability is much lower, and the adhesive layer is much less likely to undergo expansion etc. In particular, the silicone particles are preferably coated with a hydrophobic material having a hydrophobic group, such as a phenyl group.

Silicone particles are superior to other resin particles in both flexibility and heat resistance; thus, when the composition for bonding is cured, and when the composition for bonding become a cured product to form an adhesive layer, reliability due to thermal stability can also be enhanced. Since on-vehicle pressure sensors are strongly demanded to have reliability due to thermal stability, compositions for bonding comprising silicone particles are particularly preferred.

The method for producing the silicone particles is not limited. For example, the silicone particles can be produced by a known production method. For example, the silicone particles can be obtained by polymerizing known acrylic-modified silicone oil. Moreover, a monomer having an ethylenically unsaturated group mentioned above can be polymerized by a known method in the presence of the thus-obtained silicone particles, and the silicone particles can be combined with a resin formed by this polymerization.

The average particle diameter of the resin particles is not particularly limited, and is, for example, 1 µm or more and 1000 µm or less. The average particle diameter of resin particles having a spherical shape means diameter, and the average particle diameter of resin particles having a shape other than a spherical shape means the average value of the maximum diameter and the minimum diameter. The average particle diameter of resin particles means an average value obtained in such a manner that the resin particles are observed with a scanning electron microscope, and the particle diameter of 50 individual resin particles selected at random is measured by a caliper. The average particle diameter of resin particles coated with other materials as described above includes the coating layer. The average particle diameter of the resin particles is preferably 1 μm or more and 500 μm or less, and more preferably 1 μm or more and 100 μm or less, because the composition for bonding is less likely to be thickened, and the bonding strength is less likely to be reduced.

The coefficient of variation (CV value) of the particle diameter of the resin particles is 35% or less, for example. The coefficient of variation (CV value) is represented by the following formula:

$$\text{CV value (\%)} = (\rho/Dn) \times 100$$

(ρ: particle diameter standard deviation of the particles. Dn: average of the particle diameters of the particles).

The coefficient of variation (CV value) of the particle diameter of the resin particles is preferably low. For example, when the resin particles are used for a first composition for bonding, described later, the CV value is preferably 10% or less, and particularly preferably 5% or less. Moreover, when the composition for bonding is used for electronic components, such as pressure sensors, the CV value is preferably 10% or less, and particularly preferably 5% or less.

The 10% K value of the resin particles is generally 2000 N/mm$^2$ or less, preferably 500 N/mm$^2$ or less, more preferably 300 N/mm$^2$ or less, and even more preferably 100 N/mm$^2$ or less. In this case, the adhesive layer formed after bonding with the composition for bonding is much less likely to undergo shape deformation, and can easily maintain high adhesion after a reliability test. Moreover, because the 10% K value of the resin particles is 500 N/mm$^2$ or less, the recovery rate of the resin particles can be easily adjusted to 30% or less.

The 10% K value as mentioned herein refers to compressive elastic modulus when the resin particles are 10% compressed. The 10% K value can be measured in the following manner. First, using a micro-compression tester, the resin particles are compressed by the edge surface of a smooth cylindrical indenter (made of diamond; diameter: 50 μm) at 25° C. under conditions where a maximum test load of 20 mN is applied over 60 seconds. The load value (N) and compression displacement (mm) at this time are measured. The compressive elastic modulus can be determined from the measured value using the following formula:

$$10\% \, K \text{ value } (N/mm^2) = (3/2^{1/2}) \cdot F \cdot S^{-3/2} \cdot R^{-1/2}$$

load value (N) when the particles are 10% compressed and deformed
S: compression displacement (mm) when the particles are 10% compressed and deformed
R: radius (mm) of the particles The micro-compression tester is, for example, a "Fischer Scope H-100" (produced by Fischer).

The decomposition starting temperature of the resin particles in air is preferably 300° C. or more. In this case, when an adhesive layer is formed using the composition for bonding, the thermal decomposition of the resin particles is easily suppressed. In particular, high thermal stability is required for use in on-vehicle pressure sensors, and heat resistance at 300° C. or more is often required for use in power devices that are used in electric cars, hybrid cars, etc. In this respect, the decomposition starting temperature is preferably 300° C. or more.

In the resin particles, the number of aggregated particles per million of particles is preferably 100 or less. In the aggregated particles, one particle is in contact with at least one other particle. For example, when 1 million resin particles include three aggregates in which three particles are aggregated, that is, each aggregate consists of three particles, the number of aggregated particles per million of resin particles is nine. Examples of the method for measuring the number of aggregated particles include a method of counting the number of aggregated particles using a microscope in which the magnification is set so that about 50,000 particles are observed per visual field, and measuring the number of aggregated particles as the total of 20 visual fields.

The composition for bonding of the present embodiment contains other components, in addition to the resin particles mentioned above. Examples of other components include known materials contained in adhesives used in the production of components, such as optical components and electronic components.

The composition for bonding of the present embodiment is, for example, a composition comprising at least the resin particles described above, one or more resin components other than the resin particles, and a solvent (hereinafter referred to as "the first composition for bonding").

The first composition for bonding is, for example, a composition that can be used as an adhesive raw material capable of forming an adhesive layer in such a manner that the adhesive raw material is applied to an object, and then cured. Objects are bonded together by the adhesive layer.

In the first composition for bonding, there is no particular limitation on the resin component(s). Examples of the resin component(s) include thermoplastic resins and curable resins. Specific examples include vinyl resins, thermoplastic resins, curable resins, thermoplastic block copolymers, elastomers, and the like. These resin components may be used singly or in combination of two or more.

Examples of curable resins include photocurable resins and thermosetting resins. The photocurable resins preferably include photocurable resins and photopolymerization initiators. The thermosetting resins preferably include thermosetting resins and heat-curing agents.

Examples of vinyl resins include vinyl acetate resins, acrylic resins, and styrene resins. Examples of thermoplastic resins include polyolefin resins, ethylene-vinyl acetate copolymers, and polyamide resins. Examples of curable resins include epoxy resins (e.g., bisphenol F-type epoxy resins), epoxy acrylate resins, urethane resins, polyimide resins, and unsaturated polyester resins.

The curable resins may be ordinary temperature-curable resins, thermosetting resins, photocurable resins, or moisture-curable resins.

Examples of thermoplastic block copolymers include styrene-butadiene-styrene block copolymers, styrene-isoprene-styrene block copolymers, hydrogenated styrene-butadiene-styrene block copolymers, and hydrogenated styrene-isoprene-styrene block copolymers.

Examples of elastomers include styrene-butadiene copolymer rubber and acrylonitrile-styrene block copolymer rubber.

Specific examples of the resin component(s) include silicone, epoxy, fluorinated epoxy, acrylic, epoxy acrylate, and fluorinated epoxy acrylate, in terms of excellent adhesion, curability, etc.

The first, composition for bonding may be a so-called one-component adhesive in which one component material is involved in curing to exhibit adhesion, or may be a so-called two-component adhesive in which two component materials are involved in curing to exhibit adhesion. When the first composition for bonding is a two-component adhesive, at least two components, i.e., a main agent and a curing agent, are contained. The main agent may be selected from the various resin components listed above, or may be a component conventionally used as the main agent. Moreover, the curing agent is also not limited, and may be a component conventionally used as the curing agent. The first composition for bonding may also contain a heat-curing agent, a filler such as silica, a silane coupling agent, etc.

The type of solvent is not particularly limited. For example, solvents conventionally used as adhesives can be used.

The composition for bonding of the present embodiment is not limited to the first composition for bonding, and may be in other forms.

The first composition for bonding is easily cured and bonded, and is thus suitable, for example, as an adhesive for assembling optical components, such as optical lenses.

The form of the composition for bonding of the present embodiment is not particularly limited, and examples include liquid forms, such as dispersions and pastes.

The content of the resin particles in the composition for bonding of the present embodiment is not limited.

For example, the content of the resin particles can be 0.1 wt. % or more based on 100 wt. % of the components, except for the dispersion medium, in the composition for bonding. The "components, except for the dispersion medium" as mentioned herein refer to the components excluding the solvent and the like which are removed by curing, and "100 wt. % of the components, except for the dispersion medium" is the same as the weight of the cured product of the composition for bonding. When the content of the resin particles is 0.1 wt. % or more, the moisture permeability of the cured product of the composition for bonding can be easily adjusted to 90 $g/m^2$-24 h or less, and the deformation of the adhesive layer can be easily prevented. The content of the resin particles can be preferably set to 10 wt. % or more, and more preferably 20 wt. % or more, based on 100 wt. % of the components, except for the dispersion medium, in the composition for bonding. Moreover, the content of the resin particles can be set to 40 wt. % or less based on 100 wt. % of the components, except for the dispersion medium, in the composition for bonding. In this case, the moisture permeability of the cured product of the composition for bonding can be easily adjusted to 90 $g/m^2$-24 h or less, and the deformation of the adhesive layer can be easily prevented. The content of the resin particles is preferably 35 wt. % or less, and more preferably 30 wt. % or less, based on 100 wt. % of the components, except for the dispersion medium, in the composition for bonding.

The content of the resin component(s) (other than the resin particles) contained in the first composition for bonding is not limited, and can be set to, for example, 20 wt. % or more and 90 wt. % or less based on 100 wt. % of the components, except for the dispersion medium, in the composition for bonding.

In addition to the above components, the composition for bonding may contain other components within the range that does not impair the effects of the present invention. Examples of other components include metal powder or metal alloy powder, coupling agents, antifoaming agents, curing assistants, stress-lowering agents, coloring agents such as pigments and dyes, light stabilizers, surfactants, and other various additives. The composition for bonding may contain these additives singly or in combination of two or more.

The composition for bonding of the present embodiment comprises the above resin particles, which have a stress-relief effect. Accordingly, when stress is applied to the adhesive layer formed from the composition, the stress-relief action of the resin particles is exhibited; thus, the shape of the adhesive layer is less likely to be deformed. Furthermore, because a cured product with a specific thickness obtained from the composition for bonding of the present embodiment has a moisture permeability of 90 $g/m^2$-24 h or less, the expansion or contraction of the adhesive layer due to moisture etc. is suppressed; thus, the adhesive layer is less likely to be deformed and deteriorated. Accordingly, the adhesive layer can maintain high adhesion after a reliability test.

Therefore, the composition for bonding of the present embodiment is a material suitable for optical adhesives for assembling optical components, such as optical lenses, and for adhesives for assembling electronic components, such as pressure sensors (particularly adhesives for pressure sensors).

The optical adhesive of the present embodiment comprises the above composition for bonding. The optical adhesive may consist of the composition for bonding. Alternatively, the optical adhesive may contain, if necessary, components other than the composition for bonding, such as components conventionally added to optical adhesives.

The optical adhesive may comprise, for example, any of the first composition for bonding described above, and other compositions for bonding; however, in terms of easy production of damage-free optical components, it is preferable that the optical adhesive comprises the first composition for bonding.

For example, when an optical component is produced by bonding an optical lens using the above optical adhesive, the obtained optical component can be maintained in a state where the optical axis is adjusted for a long period of time. Therefore, the optical adhesive makes it possible to provide devices comprising optical components that are made more highly precise.

The adhesive for pressure sensors of the present embodiment comprises the above composition for bonding. The adhesive for pressure sensors may consist of the composition for bonding. Alternatively, the adhesive for pressure sensors may contain, if necessary, components other than the composition for bonding, such as components conventionally added to adhesives for pressure sensors.

The adhesive for pressure sensors may comprise, for example, any of the first composition for bonding described above and other compositions for bonding.

For example, when a pressure sensor is produced using the above adhesive for pressure sensors, the resulting pressure sensor has an adhesive layer portion that is less likely to be deformed over a long period of time, and is less likely to be damaged; thus, the pressure sensor can function as a highly precise sensor. Accordingly, the above adhesive for pressure sensors can provide a highly precise pressure sensor.

The composition for bonding of the present embodiment can be applied as a constituent of not only optical adhesives and adhesives for pressure sensors, but also various adhesives.

EXAMPLES

The present invention is described in more detail below with reference to Examples; however, the present invention is not limited to the embodiments of these Examples.

Production Example 1: Production of Silicone Particles A1

A solution A was prepared by dissolving 0.5 parts by weight of tert-butyl-2-ethylperoxyhexanoate (a polymerization initiator: "Perbutyl O," produced by NOF Corporation) in 30 parts by weight of both-end acrylic silicone oil ("X-22-2445," produced by Shin-Etsu Chemical Co., Ltd.). Further, an aqueous solution B was prepared by mixing 150 parts by weight of ion exchange water with 0.8 parts by weight of lauryl sulfate triethanolamine salt 40 wt. % aqueous solution (an emulsifier) and 80 parts by weight of 5 wt. % aqueous solution of polyvinyl alcohol (polymerization degree: about 2000, saponification degree: 86.5 to 89 mol %; "Gohsenol GH-20," produced by The Nippon Synthetic Chemical Industry, Co., Ltd.). After the solution A was put in a separable flask placed in a warm-bath tub, the aqueous solution B was added. Then, emulsification was performed using a shirasu porous glass (SPG) membrane (average pore diameter: about 20 μm). Thereafter, the temperature was raised to 85° C., and polymerization was performed for 9 hours. The entire quantity of particles after polymerization was washed with water by centrifugation, followed by classification, thereby obtaining silicone particles A1.

Production Example 2: Production of Silicone Particles B1

The silicone particles A1 (6.5 parts by weight) obtained in Production Example 1, 0.6 parts by weight of hexadecyltrimethylammonium bromide, 240 parts by weight of distilled water, and 120 parts by weight of methanol were put in a 500-ml separable flask placed in a warm-bath tub. After the mixture was stirred at 40° C. for 1 hour, 3.0 parts by weight of divinylbenzene and 0.5 parts by weight of styrene were added, the temperature was raised to 75° C., and the mixture was stirred for 0.5 hours. Then, 0.4 parts by weight of 2,2'-azobis(isobutyric acid) dimethyl was added, and the mixture was stirred and reacted for 8 hours. The entire quantity of particles after polymerization was washed with water by centrifugation, thereby obtaining silicone particles B1. The obtained surface-treated silicone particles B1 had an average particle diameter of 20.5 μm and a CV value of 3.5%.

Production Example 3: Production of Silicone Particles B2

Silicone particles A2 were prepared in the same manner as in Production Example 1, except that the amount of both-end acrylic silicone oil ("X-22-2445," produced by Shin-Etsu Chemical Co., Ltd.) was changed to 27 parts by weight. Silicone particles were prepared in the same manner as in Production Example 2, except that the silicone particles A1 were changed to the silicone particles A2, and the amount of divinylbenzene was changed to 3 parts by weight. The resulting silicone particles were regarded as silicone particles B2. The silicone particles B2 had an average particle diameter of 198 μm and a CV value of 3.5%.

Production Example 4: Production of Silicone Particles B3

Silicone particles A3 were prepared in the same manner as in Production Example 1, except that emulsification was performed using an SPG membrane with an average pore diameter of about 3 μm. Silicone particles were prepared in the same manner as in Production Example 2, except that the silicone particles A1 were changed to the silicone particles A3 in Production Example 2. The resulting silicone particles were regarded as silicone particles B3. The silicone particles B3 had an average particle diameter of 3.02 μm and a CV value of 4.8%.

Production Example 5: Production of Resin Particles A1

Ethylene glycol dimethacrylate (100 g), 800 g of isobornyl acrylate, 100 g of cyclohexyl methacrylate, and 35 g of benzoyl peroxide were mixed and uniformly dissolved to obtain a monomer mixed solution. A polyvinyl alcohol 1 wt. % aqueous solution (5 kg) was produced and placed in a reaction vessel. The monomer mixed solution prepared above was placed in the reaction vessel, and the mixture was stirred for 2 to 4 hours to thereby adjust the particle diameter so that droplets of the monomer had a predetermined particle diameter. Thereafter, the reaction was performed in a nitrogen atmosphere at 90° C. for 9 hours to obtain resin particles. The obtained resin particles were washed with hot water several times, followed by classification, thereby obtaining resin particles A1. The obtained resin particles A1 had an average particle diameter of 20.1 μm and a CV value of 3.1%.

Production Example 6: Production of Resin Particles A2

Ethylene glycol dimethacrylate (800 g), 200 g of styrene, and 35 g of benzoyl peroxide were mixed and uniformly dissolved to obtain a monomer mixed solution. A polyvinyl alcohol 1 wt. % aqueous solution (5 kg) was produced and placed in a reaction vessel. The monomer mixed solution prepared above was placed in the reaction vessel, and the mixture was stirred for 2 to 4 hours to thereby adjust the particle diameter so that droplets of the monomer had a predetermined particle diameter. Thereafter, the reaction was performed in a nitrogen atmosphere at 90° C. for 9 hours to obtain resin particles. The obtained resin particles were washed with hot water several times, followed by classification, thereby obtaining resin particles A2. The obtained resin particles A2 had an average particle diameter of 18.81 μm and a CV value of 3.6%.

Production Example 7: Production of Silicone Particles C1

Two types of silicone rubber particles ("KMP-601" and "KMP-602," produced by Shin-Etsu Chemical Co., Ltd.), each in an amount of 50 parts by weight, were mixed, followed by classification. The obtained silicone particles C1 had an average particle diameter of 20.5 μm and a CV value of 3.5%.

Example 1: Production of First Composition for Bonding

Bisphenol A-type epoxy acrylate (70 parts by weight; "Ebecryl 3700," produced by Daicel-Allnex Ltd.) and 30 parts by weight of bisphenol F-type epoxy resin ("jER806," produced by Mitsubishi Chemical. Corp.) as curable resins, 7 parts by weight of polymer azo initiator ("VPE-0201," produced by Wako Pure Chemical Industries, Ltd.) as a thermal radical polymerization initiator, 8 parts by weight of sebacic acid dihydrazide ("SDH," produced by Otsuka Chemical Co., Ltd.) as a heat-curing agent, 30 parts by weight of the silicone particles B1, 10 parts by weight of silica ("Admafine SO-C2," produced by Admatechs Co., Ltd.) as a filler, and 1 part by weight of 3-glycidoxypropyltrimethoxysilane ("KBM-403," produced by Shin-Etsu Chemical Co., Ltd.) as a silane coupling agent were mixed. The mixture was stirred by a planetary centrifugal mixer ("Awatori Rentaro," produced by Thinky Corporation), and then uniformly mixed by a ceramic three-roll, thereby producing a composition for bonding.

Example 2

A first composition for bonding was obtained in the same manner as in Example 1, except that the silicone particles B2 were used in place of the silicone particles B1.

Example 3

A first composition for bonding was obtained in the same manner as in Example 1, except that the resin particles A1 were used in place of the silicone particles B1.

Example 4

A first composition for bonding was obtained in the same manner as in Example 1, except that the silicone particles B3 were used in place of the silicone particles B1.

Example 5

A first composition for bonding was obtained in the same manner as in Example 1, except that 3 parts by weight of the silicone particles B3 was used in place of 30 parts by weight of the silicone particles B1.

Comparative Example 1

A first composition for bonding was obtained in the same manner as in Example 1, except that the silicone particles C1 were used in place of the silicone particles B1.

Comparative Example 2

A first composition for bonding was obtained in the same manner as in Example 1, except that the resin particles A2 were used in place of the silicone particles B1.

Comparative Example 3

A first composition for bonding was obtained in the same manner as in Example 1, except that silicone resin particles ("X-52-1621," produced by Shin-Etsu Chemical Co., Ltd.) were used in place of the silicone particles B1.

Evaluation of Particles Obtained in Production Examples (1) 10% K Value

The 10% K value of the particles was measured with a "Fischer Scope H-100" (produced by Fischer).

(2) Average Particle Diameter

The particles were observed with a scanning electron microscope, and the maximum diameter of 50 individual particles randomly selected in the observed image was determined by arithmetic mean. Thus, the average particle diameter of the particles was determined.

(3) CV Value

The particles were observed with a scanning electron microscope, the standard deviation of the particle diameter of 50 individual particles randomly selected in the observed image was determined, and the CV value of the particle diameter of the particles was determined by the above formula.

(4) Thermal Decomposition Temperature

The particles (10 mg) were heated at 30° C. to 800° C. (heating rate: 5° C./min) in an air atmosphere, and a temperature at which the weight of the particles was 5% reduced was measured using a thermogravimetric-differential thermal analyzer "TG-DTA6300" (produced by Hitachi High-Tech). This temperature was regarded as the thermal decomposition temperature.

Evaluation of Compositions for Bonding

Moisture Permeability Test of First Compositions for Bonding

The first compositions for bonding obtained in the Examples and the Comparative Examples were each applied to a thickness of 200 to 300 μm in the form of a smooth mold-releasing film using a coater. Subsequently, the applied composition was heated at 120° C. for 60 minutes, thereby obtaining a cured film for measuring moisture permeability. A cup for a moisture permeability test was produced by a method according to JIB 20208 ("Testing Methods for Determination of the Water Vapour Transmission Rate of Moisture-Proof Packaging Materials (Dish Method)"), and the cured film for measuring moisture permeability was attached thereto. The resultant was put in a high-temperature/high-humidity oven at a temperature of 80° C. and a humidity of 90% RH, and the moisture permeability was measured.

Evaluation of Shrinkage Ratio of First Compositions for Bonding

The first compositions for bonding obtained in the Examples and the Comparative Examples were each put in a syringe, and dispensed at a width of 300 μm and a length of 50 mm. Subsequently, heating was performed at 120° C. for 60 minutes to thereby obtain a cured product of the first composition for bonding. The length of the long side after curing was measured by a caliper, and the shrinkage ratio was determined from the rate of change with respect to the length of the long side before curing. A shrinkage ratio of 98% or more and less than 101% was evaluated as "⊚," a shrinkage ratio of 95% or more and less than 98% was evaluated as "○," a shrinkage ratio of 93% or more and less than 95% was evaluated as "Δ," and a shrinkage ratio of less than 93% was evaluated as "x." A shrinkage ratio of 100% indicates that the length of the long side is not changed before or after curing.

Reliability Test of First Compositions for Bonding (1) Bonding Strength

The first compositions for bonding obtained in the Examples and the Comparative Examples were each placed in a syringe, and applied to a printed circuit board using a dispenser. Then, a pressure-sensor chip was mounted on the applied first composition for bonding. Subsequently, the first composition for bonding was cured by heating at 150° C. for 10 minutes, and the pressure-sensor chip was bonded thereto, thereby obtaining a semiconductor sensor.

The bonding strength of the obtained semiconductor sensor at 200° C. was measured, and evaluated according to the following criteria.

Assessment Criteria for Determining Bonding Strength
○: The shear strength was 150 N/cm² or more.
Δ: The shear strength was 100 N/cm² or more and less than 150 N/cm.
x: The shear strength was less than 100 N/cm².

(2) Thermal Cycle Resistance Characteristics (Reliability Test)

Using a liquid thermal shock chamber ("TSB-51," produced by ESPEC), the obtained semiconductor sensors were each subjected to a thermal cycle test in which one cycle consisted of maintaining the sensor at −40° C. for 5 minutes, then heating it to 120° C., maintaining it at 120° C. for 5 minutes, and then cooling it to −40° C. The sample was taken out after 500 cycles.

Subsequently, the sample was observed with a stereoscopic microscope ("SMZ-10," produced by Nikon Corporation). Whether cracks were formed in the adhesive layer, or whether the adhesive layer was peeled from the substrate was observed, and the thermal cycle resistance characteristics were determined according to the following criteria.

Assessment Criteria for Determining Thermal Cycle Resistance Characteristics
○: No cracks were formed in the adhesive layer, and the adhesive layer was not peeled from the substrate.
Δ: A few cracks were formed in the adhesive layer, or the adhesive layer was slightly peeled from the substrate.
x: Large cracks were formed in the adhesive layer, or the adhesive layer was significantly peeled from the substrate.

Table 1 shows the results of the physical property evaluation of the Production Examples and silicone resin particles.

TABLE 1

| Production Example | Particles | Recovery rate (%) | 10% K value | Decomposition starting temperature (° C.) |
|---|---|---|---|---|
| Production Example 2 | Silicone particles B1 | 13.3 | 80 | 330 |
| Production Example 3 | Silicone particles B2 | 18 | 300 | 315 |
| Production Example 4 | Silicone particles B3 | 15 | 120 | 330 |
| Production Example 5 | Resin particles A1 | 7 | 1600 | 225 |
| Production Example 6 | Resin particles A2 | 55 | 694 | 210 |
| Production Example 7 | Silicone particles C | 68 | 50 | 350 |
| — | Silicone resin particles | 11.1 | 3890 | 430 |

Table 2 shows the results of the evaluation tests of the compositions for bonding obtained in the Examples and the Comparative Examples.

TABLE 2

| Example/ Comparative Example | Particles | Moisture permeability (g/m²-24 h) | Shrinkage ratio | Bonding strength | Thermal cycle resistance characteristics |
|---|---|---|---|---|---|
| Example 1 | Silicone particles B1 | 70 | ⊚ | ○ | ○ |
| Example 2 | Silicone particles B2 | 63 | ○ | ○ | ○ |
| Example 3 | Resin particles A1 | 40 | Δ | Δ | Δ |
| Example 4 | Silicone particles B3 | 68 | ⊚ | ○ | ○ |
| Example 5 | Silicone particles B3 | 43 | ⊚ | ○ | ○ |
| Comparative Example 1 | Silicone particles C | 100 | X | X | Δ |
| Comparative Example 2 | Resin particles A2 | 40 | X | Δ | Δ |
| Comparative Example 3 | Silicone resin particles | 100 | X | X | X |

In the compositions for bonding obtained in the Examples, the recovery rate of the resin particles was 30% or less, and the moisture permeability of the cured products with a thickness of 250±50 μm obtained from the compositions for bonding was 90 g/m²-24 h or less; thus, the adhesive layers (cured products) formed after bonding were less likely to undergo shape deformation, and maintained high adhesion even after the reliability test. Therefore, the compositions for bonding obtained in the Examples are materials suitable for optical adhesives for assembling optical components, such as optical lenses, and adhesives for assembling electronic components, such as pressure sensors (particularly adhesives for pressure sensors).

The invention claimed is:

1. A composition for bonding comprising resin particles and a curable resin, wherein
the resin particles have a recovery rate of 30% or less, as measured by applying a maximum test load of 10 mN per resin particle to the resin particles, thereafter removing the load, and measuring a compression displacement L1 (mm) and recovery displacement L2 (mm), and calculating the recovery rate based on the following formula:

recovery rate (%)=($L2/L1$)×100, and a cured product of the composition with a thickness of 250±50 μm has a moisture permeability of 90 g/m²-24 h or less, as measured in accordance with JIS Z0208.

2. The composition for bonding according to claim 1, wherein the resin particles have a 10% K value of 500 N/mm² or less, as measured by compressing the resin particles at 25° C. under conditions wherein a maximum test load of 20 mN is applied over 60 seconds, measuring a load value (N) and compression displacement (mm), and calculating the 10% K value based on the following formula:

10% $K$ value (N/mm²)=$(3/2^{1/2}) \cdot F \cdot S^{-3/2} \cdot R^{-1/2}$ wherein F is the load value (N) when the particles are 10% compressed and deformed, S is the compression displacement (mm) when the particles are 10% compressed and deformed, and R is a radius (mm) of the particles.

3. The composition for bonding according to claim 1, wherein the resin particles have a decomposition starting temperature of 300° C. or more.

4. The composition for bonding according to claim 1, wherein the resin particles are silicone particles.

5. The composition for bonding according to claim 1, wherein the content of the resin particles is 0.1 wt. % or more and 40 wt. % or less.

6. An optical adhesive comprising the composition for bonding according to claim 1.

7. An adhesive for pressure sensors, the adhesive comprising the composition for bonding according to claim 1.

* * * * *